US012509769B1

(12) United States Patent
Stanbery et al.

(10) Patent No.: US 12,509,769 B1
(45) Date of Patent: Dec. 30, 2025

(54) REMOTE REACTANT RESERVOIRS FOR CODEPOSITION WITH VARIABLE MELT AREA EVAPORANT FLUX CONTROL

(71) Applicant: HelioSourceTech, LLC, Tucson, AZ (US)

(72) Inventors: Billy Jack Stanbery, Austin, TX (US); Walter Seaman, Tucson, AZ (US)

(73) Assignee: HelioSourceTech, LLC, Tucson, AZ (US)

( * ) Notice: Subject to any disclaimer, the term of this patent is extended or adjusted under 35 U.S.C. 154(b) by 0 days.

(21) Appl. No.: 18/144,582

(22) Filed: May 8, 2023

Related U.S. Application Data

(62) Division of application No. 17/677,837, filed on Feb. 22, 2022.

(60) Provisional application No. 63/161,043, filed on Mar. 15, 2021.

(51) Int. Cl.
*C23C 16/44* (2006.01)
*C23C 16/448* (2006.01)
*C23C 16/52* (2006.01)

(52) U.S. Cl.
CPC .......... *C23C 16/4485* (2013.01); *C23C 16/52* (2013.01)

(58) Field of Classification Search
CPC ............................ C23C 16/4485; C23C 16/52
See application file for complete search history.

(56) References Cited

U.S. PATENT DOCUMENTS 4,700,660 A * 10/1987 Levchenko ........... C23C 14/243 118/726
5,031,229 A * 7/1991 Chow ..................... F27B 14/14 392/389
2003/0026601 A1* 2/2003 Jabbour .................. C23C 14/24 392/389
2010/0154712 A1* 6/2010 Tamura ................. C23C 14/246 118/726
2013/0276706 A1* 10/2013 Lee ......................... C23C 14/14 118/726
2014/0295600 A1* 10/2014 Lin ....................... C23C 14/243 118/724
2019/0218656 A1* 7/2019 Mu ....................... C23C 14/243

FOREIGN PATENT DOCUMENTS

WO WO2020-185284 * 9/2020

* cited by examiner

*Primary Examiner* — Joseph A Miller, Jr.

(57) ABSTRACT

Methods include operating a reactant precursor vapor flux control and delivery system located in a vacuum deposition chamber comprising conveying feedstock from a feedstock buffer reservoir to an evaporation source reservoir coupled to the feedstock buffer reservoir, the evaporation source reservoir having a cavity shape that defines a evaporant pool surface area that increases as a function of fill level and conveying reactant precursor vapor from the evaporation source reservoir to a deposition zone. Apparatus includes a reactant precursor vapor flux control and delivery system located in a vacuum deposition chamber, the reactant precursor vapor flux control and delivery system comprising a feedstock buffer reservoir and an evaporation source reservoir coupled to the feedstock buffer reservoir, the evaporation source reservoir having a cavity shape that defines a evaporant pool surface area that increases as a function of fill level.

14 Claims, 6 Drawing Sheets

REMOTE REACTANT RESERVOIRS FOR CODEPOSITION WITH VARIABLE MELT AREA EVAPORANT FLUX CONTROL

CROSS-REFERENCE TO RELATED APPLICATION

Referring to the application data sheet filed herewith, this application is a divisional of and claims a benefit of priority under 35 U.S.C. from co-pending utility patent application U.S. Ser. No. 17/677,837, filed Feb. 22, 2022; and claims a benefit of priority under 35 U.S.C. 119 (e) from co-pending provisional patent application U.S. Ser. No. 63/161,043, filed Mar. 15, 2021, the entire contents of both of which are hereby expressly incorporated herein by reference for all purposes.

BACKGROUND

Evaporation sources are often used to deposit high quality complex materials such as compound alloy coatings on product substrates that are within or passing through sequential reaction chambers. These processes often utilize reactive codeposition of multiple precursor fluxes evaporated from separate source reservoirs operating at very different temperatures to achieve optimal reactant ratios and growth rates for coatings. A common approach is to position the higher operating temperature sources entirely within the reaction vessel with sufficient precursor supply to operate continuously between scheduled preventive maintenance shutdowns, but this approach dramatically increases the reactor's thermal mass. Using remote reservoirs for the lower evaporation temperature materials reduces the reactor's internal volume and thermal mass, allowing those reservoirs to operate at lower temperatures than those inside the reactor. The rate of vapor mass transport injection from external reservoir to distribution manifolds within the reactor is then controlled by both the reservoir's temperature and variable-conductance valves between them. But if these lower evaporation temperature materials have poor thermal conductivity and high thermal mass, cooldown to open the reservoir for refilling can take a very long time, reducing tool availability for production.

Heretofore, the requirements of reducing reactor internal volume and thermal mass and reducing the time needed to cooldown to open a reservoir for refilling referred to above have not been fully met. In view of the foregoing, there is a need in the art for a solution that simultaneously solves all of these problems.

SUMMARY

There is a need for the following embodiments of the present disclosure. Of course, the present disclosure is not limited to these embodiments.

According to an embodiment of the present disclosure, a process comprises operating a reactant precursor vapor flux control and delivery system located in a vacuum deposition chamber comprising conveying feedstock from a feedstock buffer reservoir to an evaporation source reservoir coupled to the feedstock buffer reservoir, the evaporation source reservoir having a cavity shape that defines a evaporant pool surface area that increases as a function of fill level and conveying reactant precursor vapor from the evaporation source reservoir to a deposition zone.

According to another embodiment of the present disclosure, a machine comprises: a reactant precursor vapor flux control and delivery system located in a vacuum deposition chamber, the reactant precursor vapor flux control and delivery system comprising a feedstock buffer reservoir and an evaporation source reservoir coupled to the feedstock buffer reservoir, the evaporation source reservoir having a cavity shape that defines a evaporant pool surface area that increases as a function of fill level.

These, and other, embodiments of the present disclosure will be better appreciated and understood when considered in conjunction with the following description and the accompanying drawings. It should be understood, however, that the following description, while indicating various embodiments of the present disclosure and numerous specific details thereof, is given for the purpose of illustration and does not imply limitation. Many substitutions, modifications, additions and/or rearrangements may be made within the scope of embodiments of the present disclosure, and embodiments of the present disclosure include all such substitutions, modifications, additions and/or rearrangements.

BRIEF DESCRIPTION OF THE DRAWINGS

The drawings accompanying and forming part of this specification are included to depict certain embodiments of the present disclosure. A clearer concept of the embodiments described in this application will be readily apparent by referring to the exemplary, and therefore nonlimiting, embodiments illustrated in the drawings. The described embodiments may be better understood by reference to one or more of these drawings in combination with the following description presented herein. It should be noted that the features illustrated in the drawings are not necessarily drawn to scale.

DETAILED DESCRIPTION

Figure 1A:
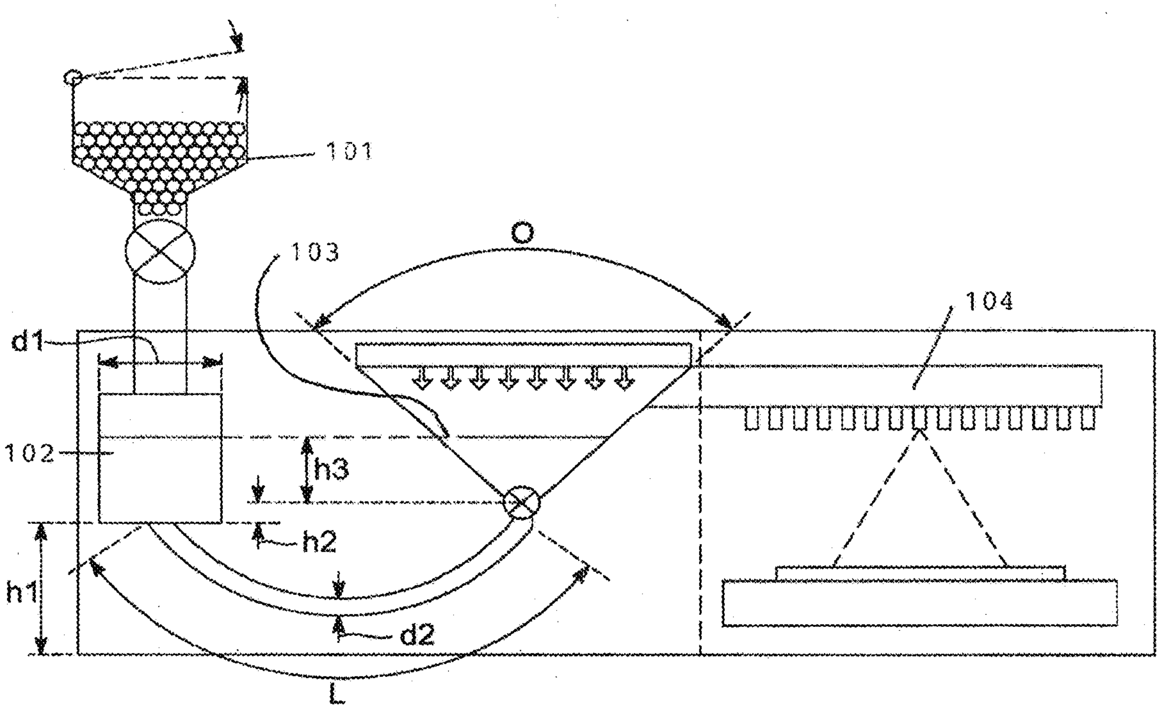
FIGS. 1A-1B are orthographic projection views of a machine in accordance with an embodiment of the present disclosure.

Embodiments presented in the present disclosure and the various features and advantageous details thereof are explained more fully with reference to the nonlimiting embodiments that are illustrated in the accompanying drawings and detailed in the following description. Descriptions of well-known materials, techniques, components and equipment are omitted so as not to unnecessarily obscure the embodiments of the present disclosure in detail. It should be understood, however, that the detailed description and the specific examples are given by way of illustration only and not by way of limitation. Various substitutions, modifications, additions and/or rearrangements within the scope of the underlying inventive concept will become apparent to those skilled in the art from this disclosure.

The disclosure of this application is technically related to copending U.S. Ser. No(s). 63/161,033, filed Mar. 15, 2021; U.S. Ser. No(s). 63/161,038, filed Mar. 15, 2021; and U.S. Ser. No(s). 63/161,047, filed Mar. 15, 2021.

In general, the context of an embodiment of the present disclosure can include manufacture of semiconductor alloys, superconductor alloys, or other multinary functional coatings. For example, the context of an embodiment of the present disclosure can include manufacture of the (Ag,Cu)(In,Ga)(S,Se) material system on substrates for solar photovoltaic modules.

Embodiments of this disclosure can include reduced thermal mass of the heated precursor reservoir achieved by reducing its volume, providing greater production tool availability for manufacturing by reducing its heat-up and cooldown times. Embodiments of this disclosure can include rapid flux control by changing the melted liquid precursor's surface area instead of just its temperature alone. Embodiments of this disclosure can include mechanisms for refilling internal feedstock reservoirs during operation to further reduce the volume of heated material while still providing long runtimes between shut-down for maintenance and cleaning, further increasing production tool availability for manufacturing.

The total flux from an evaporating liquid surface is given by the product of its surface area and vapor pressure at its temperature. Embodiments of this disclosure can control total delivered flux through various alternative implementations that control/change the surface area of the melt providing that flux. Embodiments of this disclosure can include internal buffer reservoirs maintained at lower temperatures than the evaporant pool surface that may be refilled during operation from outside the controlled reactor environment via atmospheric load-locks. The evaporant pool surface may be differentially heated from the bulk of an associated reservoir using pulsed radiative heating sources to selectively heat the surface.

An atmospheric isolation valve separating a feed mechanism for reaction precursor feedstock appropriate for the form factor of the raw material (e.g. wire feed mechanism, pellet or granular feed helical screw or auger conveyor, gravity-fed chute) from a temperature-controlled vacuum container incorporating both lower and higher higher-temperature zones. The higher temperature zone distributes the reactant vapor into the reaction zone where the codeposited film coatings are to be grown, and the lower temperature zone is where the reservoir of precursor material is stored that is used to control the fill level of the liquid whose total surface area controls the rate of reactant evaporation.

Examples of relevant feature selection and optimization considerations will be provided herein using the example of reactive codeposition of semiconductor alloys from the (Ag,Cu)(In,Ga)(S,Sc) material system (hereafter ACIGS) on substrates for solar photovoltaic module manufacturing. In this material system the codeposition reaction to form high quality semiconductor films on a surface is preferably in the range of 400-600° C., a reactor temperature range in which Cu is solid but all five of the other principal constituent elements are liquid. The vapor pressure of all these metals in this temperature range is inadequate to provide sufficient evaporant fluxes for high-rate deposition, whereas the vapor pressure of sulfur and selenium are far too high to permit the long mean-free paths required for the metals to reach the substrate surface without excessive scattering, leading to low collection efficiency and debris generation.

Figure 1B:
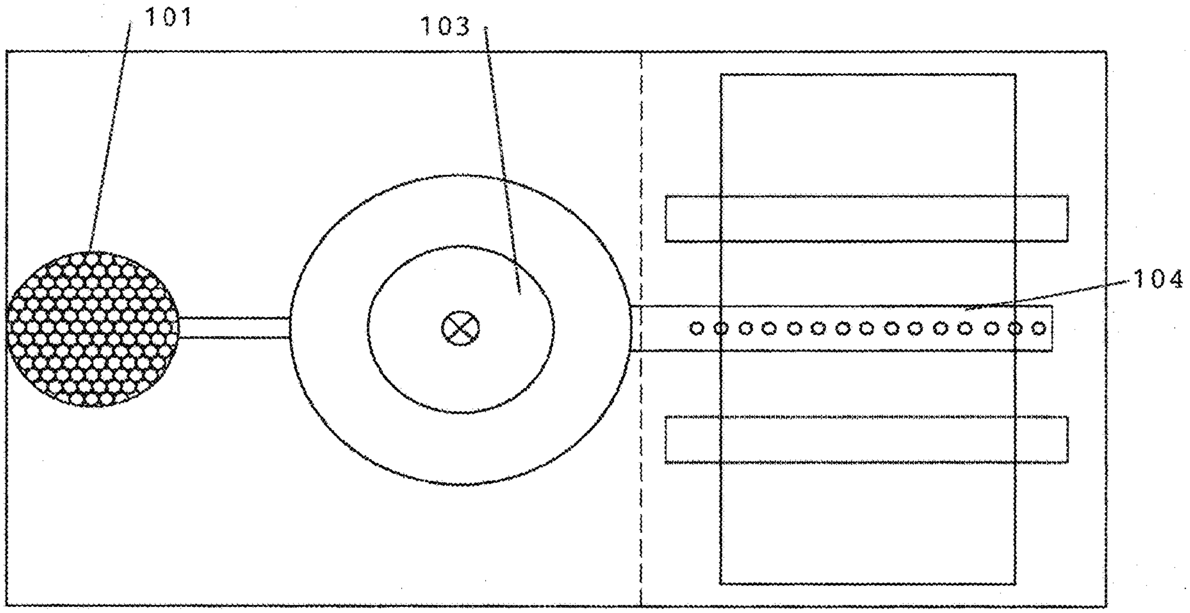

FIG. 1 is an elevation view and FIG. 1B is a plan view of an exemplary realization of a system for low vapor pressure (e.g. Selenium) reactant precursor vapor flux control and delivery system using Se-pellet feedstock feed mechanism 101, a feedstock buffer reservoir 102 and a conical evaporation source reservoir 103 in a lower-temperature zone with flux distribution manifold 104 in a higher temperature zone. An atmospheric load lock 105 includes an atmospheric isolation valve 106.

FIGS. 1A-1B show an exemplary implementation for precursor reactants such as sulfur and selenium whose evaporant source reservoir must be kept at much lower temperature than the reaction zone to prevent excessive vapor pressure. For example, pellets of selenium at temperature TO can be loaded through the sealable opening shown at the top of the feed chute with a valve connecting it via a tube to the melt pool closed to prevent air from entering. After closing the refill lid and evacuating the feed chamber, the valve can be opened, and the selenium feedstock pellets then replenish the reservoir and melt therein at temperature T3. In this example the reservoir is a cylinder with internal diameter of d1 filled to a level of (h2+h3). As this reservoir is refilled or depleted during operation, it may be moved up or down by changing the height h1 to control the surface area of the conical evaporation pool to which it is connected by a tube of diameter d and length L. In this exemplary geometry the total volume of molten selenium $$V=(h1+h2)\times\pi\left(\frac{d1}{2}\right)^2+L\times\pi\left(\frac{d2}{2}\right)^2+\frac{\pi}{3}h3^3\times\left(\tan\frac{\theta}{2}\right)^2.$$

Lowering the molten reservoir by decreasing h1 sufficiently to increase h2 by $$\Delta h2=\frac{4\times h3^3}{3\times d1^2}\times\left(\tan\frac{\theta}{2}\right)^2$$

reduces h3 to zero since the melt will flow back into the molten reservoir and the valve at the base of conical evaporator can be closed to isolate the reactor from any further injection of selenium vapor.

The total selenium transport rate from that evaporation pool through the distribution manifold for steady-state injection into the reaction zone is determined by the conductance between them and the mass flow balance between evaporation, condensation, and flow into the reactor at pressure P2 through the distributor at temperature T2. If the conductance is not changed, the difference between the pressure P1 inside the conical evaporator and the equilibrium vapor pressure P0 of the evaporant with a melt surface at constant temperature T1 is reduced if the melt surface area is increased since the evaporation flux is directly proportional to that area. Increasing h3 thus increases the rate of evaporant vapor mass transport from the source into the reactor.

The surface of the evaporant pool may be differentially heated to a temperature T1>T3 by radiative heating from above using arc discharge lamps, resistive heating coils, or directed energy beams such as microwave, masers or lasers to further modulate the total chalcogen vapor transport rate. Using these features the evaporation process for alloy mixtures may be tuned to provide steady state fluxes of mixed sulfur and selenium vapor to the distribution manifold into the reaction zone.

Figure 2A:
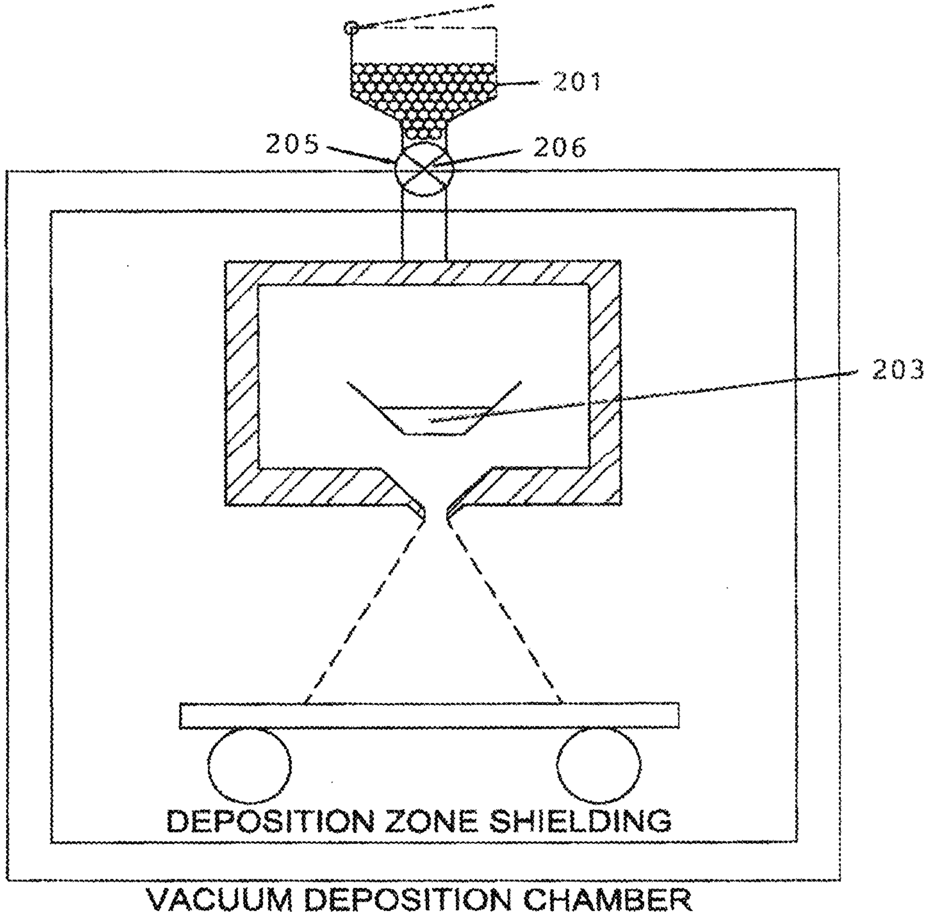
FIGS. 2A-2B are orthographic projection views of a machine in accordance with an embodiment of the present disclosure.
Figure 2B:
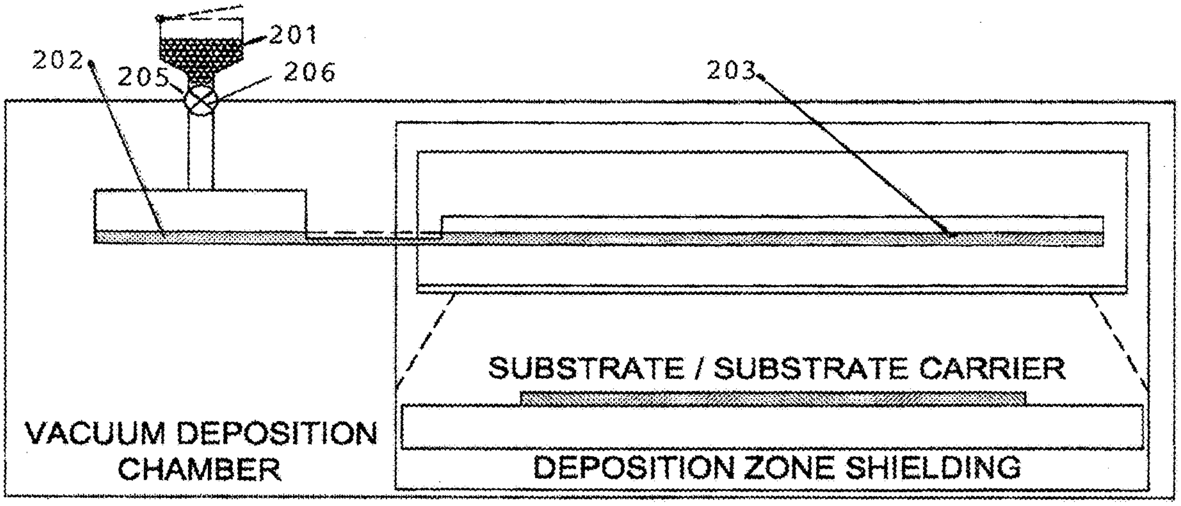

FIG. 2A is an elevation cross section and FIG. 2B is a side view of an exemplary realization of a system for low melting point (ex. Ga or In) reactant precursor vapor flux control and delivery system using a feedstock feed mechanism 201, a feedstock buffer reservoir 202 in a lower-temperature zone where it is liquid and trapezoidal cross-section evaporation source reservoir 203 in higher temperature zone where it has the desired vapor pressure. An atmospheric load lock 205 includes an atmospheric isolation valve 206.

FIGS. 2A-2B show an exemplary implementation for precursor reactants such as gallium or indium, which both melt at temperatures (T3) far below those required to provide adequate flux (T1), which in turn are far above the temperature of the reaction zone (T2). In this context the variable surface area of the evaporating melt pool which delivers the flux to the reaction zone is contained in crucible zones with a non-uniform (e.g. trapezoidal) cross-section inside a metal evaporation source, so that the melt level may be used to control the total evaporation rate. These crucibles are in turn fed from a lower-temperature reservoir external to the hot zone surrounding the high-temperature (T1) evaporation source crucibles.

Figure 3A:
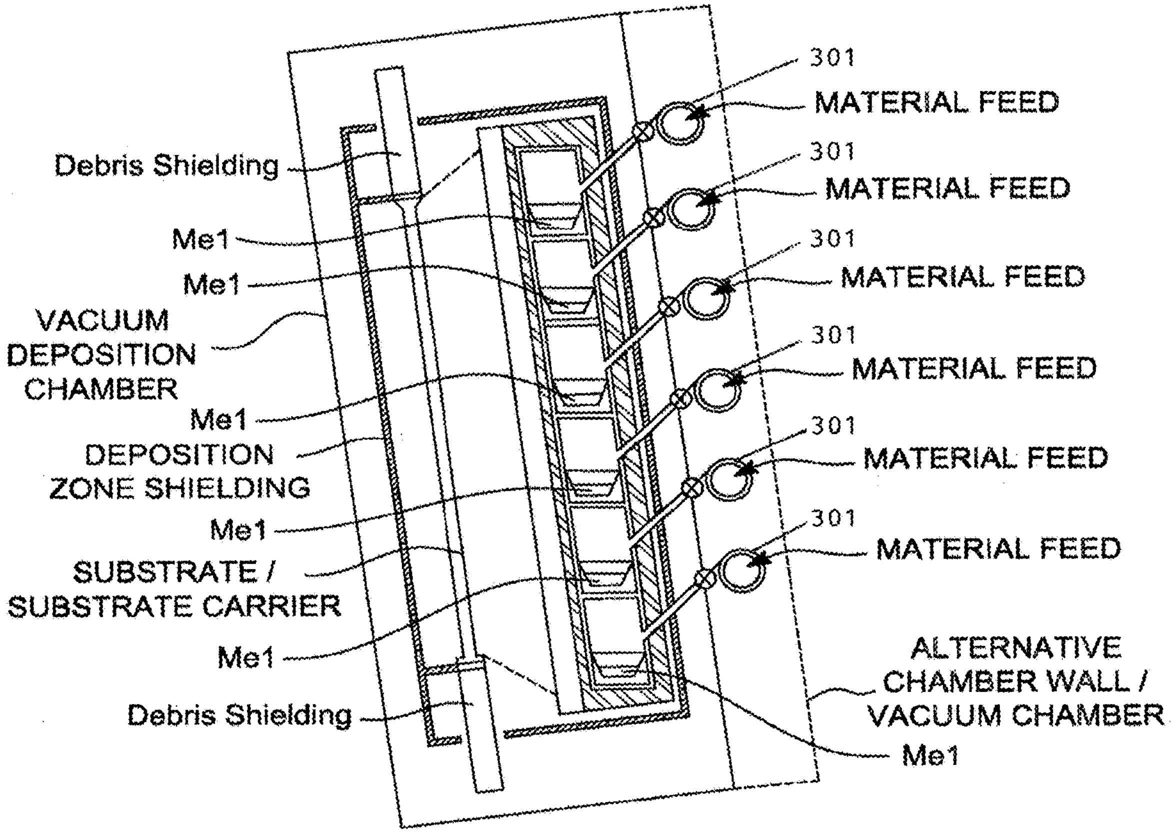
FIGS. 3A-3B are orthographic projection views of a machine in accordance with an embodiment of the present disclosure.
Figure 3B:
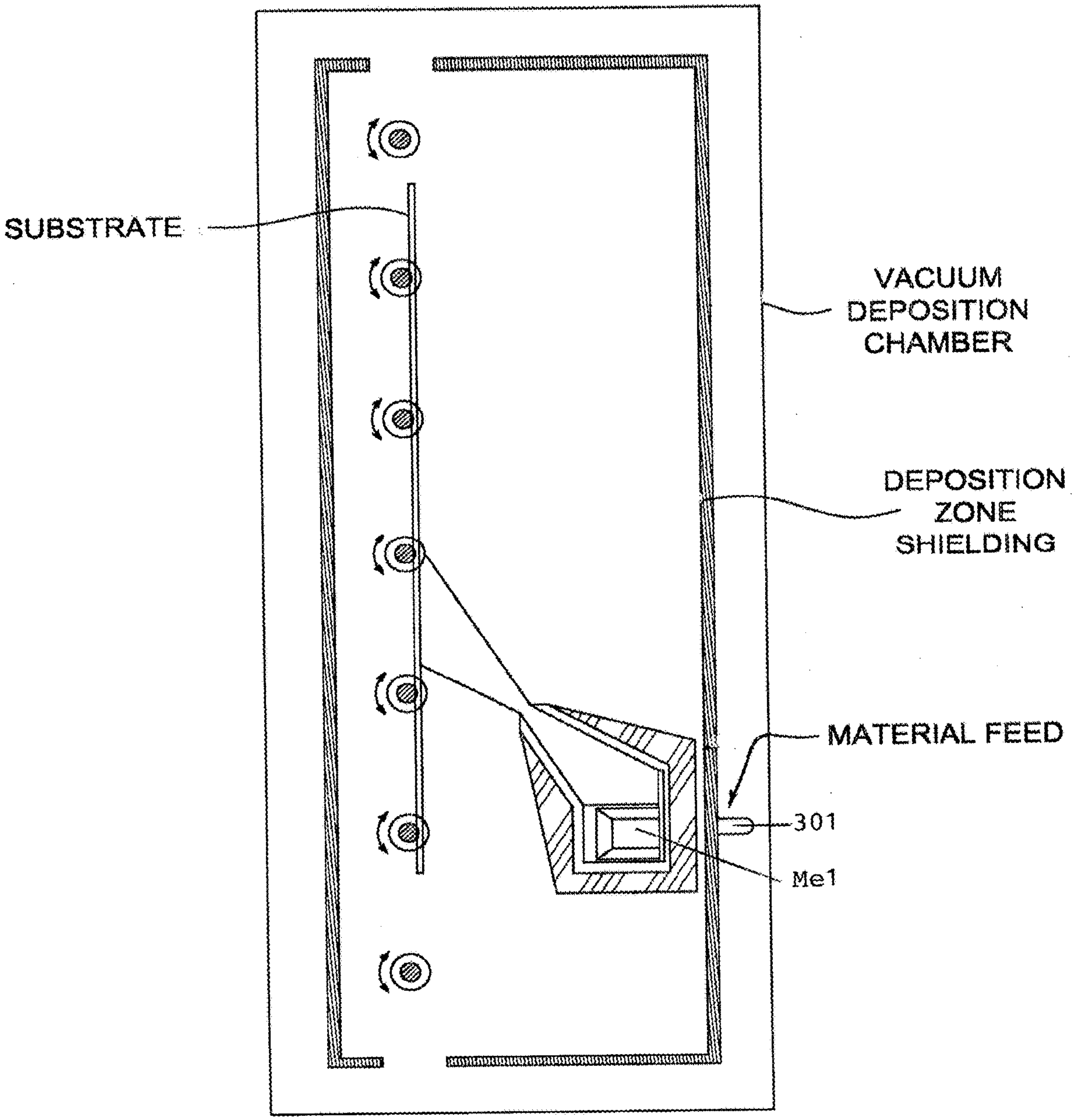

FIG. 3A is an elevation cross section and FIG. 3B is a plan view cross section of an exemplary realization of a system designed for near-vertical substrate transport, for high melting point (ex. Ag or Cu) reactant precursor vapor flux control and delivery system using wire feedstock 301 in lower-temperature zone where it remains solid and trapezoidal cross-section evaporation source reservoir Mel in higher temperature zone where it melts and has the desired vapor pressure.

FIGS. 3A-3B show an exemplary implementation for precursor reactants such as copper, whose melt temperature is far higher than the temperature of the reaction zone (T2). Here the feedstock source may be kept inside the reactor itself (at T3) and fed by mechanical means directly into the evaporating melt pool (at T1), which delivers the flux to the reaction zone, that is contained in crucible zones with a non-uniform (e.g. trapezoidal) cross-section inside a metal evaporation source. This feed mechanism could be a wire-feed, helical screw or auger conveyor, gravity-fed chute or other device depending on the form factor of the copper reactant feedstock. Because of the relatively high melting point of the metals that would be used in this implementation, the feedstock material may optionally be stored in vacuum and in close proximity to the metal source where it would get waste heat from the source, which would minimize the thermal perturbation of the source when adding feedstock to the melt pool. In FIGS. 3A-3B, the exemplary system is shown for a slightly tilted vertical system which has the added benefit of minimizing debris falling onto the substrate by entrapping the falling debris in containers above and below the plane of substrate transport. The system is shown with a plurality of trapezoidal crucibles across the width of the substrate. By varying the feed rate of the feedstock, the height of the melt pool may be varied across the height of the substrate to control coating uniformity transverse to the direction of transport. This technique could also be effectively utilized in a horizontal deposition system.

An embodiment of the present disclosure can also be included in a kit-of-parts. The kit-of-parts can include some, or all, of the components that an embodiment of the present disclosure includes. The kit-of-parts can be an in-the-field retrofit kit-of-parts to improve existing systems that are capable of incorporating an embodiment of the present disclosure. The kit-of-parts can include software, firmware and/or hardware for carrying out an embodiment of the present disclosure. The kit-of-parts can also contain instructions for practicing an embodiment of the present disclosure. Unless otherwise specified, the components, software, firmware, hardware and/or instructions of the kit-of-parts can be the same as those used in an embodiment of the present disclosure.

An embodiment of the present disclosure can also utilize data processing methods that transform signals from sensors and/or transducers to machine control signals. For example, an embodiment of the present disclosure can be combined with instrumentation to obtain state variable information to actuate interconnected discrete hardware elements. For instance, an embodiment of the present disclosure can include the use of temperature data to control machine configuration and/or operational parameters.

Practical Applications

A practical application of an embodiment of the present disclosure that has value within the technological arts is co-evaporation of thin film devices. Further, an embodiment of the present disclosure is useful in conjunction with co-evaporation of the (Ag,Cu)(In,Ga)(S,Se) material system (that is used for the purpose of generating electricity), or in conjunction with co-evaporation of super conductors (such as are used for the purpose of conducting electricity with no resistance), or the like. There are virtually innumerable uses for embodiments of the present disclosure, all of which need not be detailed here.

Definitions

The term compound is intended to mean a substance formed when two or more chemical elements are chemically bonded together, the elements present in ratios with a limited range of variation and characteristic crystal structure. The term phase is intended to mean a limited range of compositions of a mixture of the elements (in a thermochemical system) throughout which the chemical potential of the mixture varies with composition, and which either changes discontinuously or remains constant outside of that range. The phrase cation content is intended to mean the percentage or relative amount of a given cation of interest (relative to total number of atoms) in a given volume or mass of interest. The selenium atoms are not cations, they are technically anions and cation content is normalized to the total number of atoms in the film per unity volume. The term absorber is intended to mean the photon absorbing portion of a photovoltaic device which can generate current in operation. Other parts of the cell also absorb light but if they cannot generate current this is called “parasitic absorption”. The term buffer is intended to mean the junction forming region of a photovoltaic. The term emitter is intended to mean the negative contact of an illuminated photovoltaic without current flow. The term amorphous transparent conductive layer is intended to mean a non-crystalline, substantially photon transparent, electronically conducting portion of a photovoltaic. The term back contact is intended to mean the contact of a photovoltaic on the side opposite the incident illumination. The term photovoltaic is intended to mean an article of manufacture for the generation of a voltage when radiant energy falls on the boundary between dissimilar substances (as two different semiconductors).

The term vapor distribution manifold is intended to mean the distribution manifold of a vapor (evaporation source) source. The term uniformly is intended to mean unvarying or deviating very little from a given and/or expected value (e.g, within 10% of). The term substantially is intended to mean largely but not necessarily wholly that which is specified. The term approximately is intended to mean at least close to a given value (e.g., within 10% of). The term generally is intended to mean at least approaching a given state. The term coupled is intended to mean connected, although not necessarily directly, and not necessarily mechanically. The term proximate, as used herein, is intended to mean close, near adjacent and/or coincident; and includes spatial situations where specified functions and/or results (if any) can be carried out and/or achieved. The term distal, as used herein, is intended to mean far, away, spaced apart from and/or non-coincident, and includes spatial situation where specified functions and/or results (if any) can be carried out and/or achieved. The term deploying is intended to mean designing, building, shipping, installing and/or operating.

The terms first or one, and the phrases at least a first or at least one, are intended to mean the singular or the plural unless it is clear from the intrinsic text of this document that it is meant otherwise. The terms second or another, and the phrases at least a second or at least another, are intended to mean the singular or the plural unless it is clear from the intrinsic text of this document that it is meant otherwise. Unless expressly stated to the contrary in the intrinsic text of this document, the term or is intended to mean an inclusive or and not an exclusive or. Specifically, a condition A or B is satisfied by any one of the following: A is true (or present) and B is false (or not present), A is false (or not present) and B is true (or present), and both A and B are true (or present). The terms a and/or an are employed for grammatical style and merely for convenience.

The term plurality is intended to mean two or more than two. The term any is intended to mean all applicable members of a set or at least a subset of all applicable members of the set. The phrase any integer derivable therein is intended to mean an integer between the corresponding numbers recited in the specification. The phrase any range derivable therein is intended to mean any range within such corresponding numbers. The term means, when followed by the term "for" is intended to mean hardware, firmware and/or software for achieving a result. The term step, when followed by the term "for" is intended to mean a (sub) method, (sub) process and/or (sub) routine for achieving the recited result. Unless otherwise defined, all technical and scientific terms used herein have the same meaning as commonly understood by one of ordinary skill in the art to which this present disclosure belongs. In case of conflict, the present specification, including definitions, will control.

The described embodiments and examples are illustrative only and not intended to be limiting. Although embodiments of the present disclosure can be implemented separately, embodiments of the present disclosure may be integrated into the system(s) with which they are associated. All the embodiments of the present disclosure disclosed herein can be made and used without undue experimentation in light of the disclosure. Embodiments of the present disclosure are not limited by theoretical statements (if any) recited herein. The individual steps of embodiments of the present disclosure need not be performed in the disclosed manner, or combined in the disclosed sequences, but may be performed in any and all manner and/or combined in any and all sequences. The individual components of embodiments of the present disclosure need not be formed in the disclosed shapes, or combined in the disclosed configurations, but could be provided in any and all shapes, and/or combined in any and all configurations. The individual components need not be fabricated from the disclosed materials, but could be fabricated from any and all suitable materials. Homologous replacements may be substituted for the substances described herein. Agents which are chemically related may be substituted for the agents described herein where the same or similar results would be achieved.

Various substitutions, modifications, additions and/or rearrangements of the features of embodiments of the present disclosure may be made without deviating from the scope of the underlying inventive concept. All the disclosed elements and features of each disclosed embodiment can be combined with, or substituted for, the disclosed elements and features of every other disclosed embodiment except where such elements or features are mutually exclusive. The scope of the underlying inventive concept as defined by the appended claims and their equivalents cover all such substitutions, modifications, additions and/or rearrangements.

The appended claims are not to be interpreted as including means-plus-function limitations, unless such a limitation is explicitly recited in a given claim using the phrase(s) "means for" or "mechanism for" or "step for". Sub-generic embodiments of this disclosure are delineated by the appended independent claims and their equivalents. Specific embodiments of this disclosure are differentiated by the appended dependent claims and their equivalents.

What is claimed is:

1. A method, comprising:

operating a reactant precursor vapor flux control and delivery system located in a vacuum deposition chamber comprising:

conveying melted liquid feedstock from a feedstock buffer reservoir to an evaporation source reservoir remotely mechanically liquid level coupled to the feedstock buffer reservoir, the evaporation source reservoir having a cavity shape that defines an evaporant liquid pool surface area that increases as a function of fill level of the evaporation source reservoir; and conveying reactant precursor vapor from the evaporation source reservoir to a deposition zone, wherein a fill level of melted liquid feedstock in the feedstock buffer reservoir is substantially equal to a fill level of melted liquid feedstock in the evaporation source reservoir.

2. The method of claim 1, wherein the feedstock buffer reservoir is located in a lower-temperature zone where a reactant precursor is liquid and the evaporation source reservoir includes a trapezoidal cross-section evaporation source reservoir located in a higher-temperature zone where the reactant precursor has a desired vapor pressure, wherein the lower-temperature zone has a first temperature that is lower than a second temperature of the higher-temperature zone.

3. The method of claim 1, further comprising conveying feedstock from a feedstock source to the feedstock buffer reservoir.

4. The method of claim 3, wherein conveying feedstock from the feedstock source to the feedstock buffer reservoir comprises conveying feedstock from the feedstock source through an atmospheric load lock.

5. The method of claim 4, wherein conveying feedstock from the feedstock source through an atmospheric load lock comprises using a feed mechanism coupled to both the feedstock source and the feedstock buffer reservoir.

6. The method of claim 1, further comprising providing at least one of selenium, gallium, indium, silver or copper feedstock pellets to the feedstock buffer reservoir.

7. A method, comprising:

operating a reactant precursor vapor flux control and delivery system located in a vacuum deposition chamber comprising:

conveying melted liquid feedstock from a feedstock buffer reservoir to an evaporation source reservoir remotely mechanically liquid level coupled to the feedstock buffer reservoir, the evaporation source reservoir having a cavity shape that defines an evaporant liquid pool surface area that increases as a function of fill level of the evaporation source reservoir; and conveying reactant precursor vapor from the evaporation source reservoir to a deposition zone, wherein the feedstock buffer reservoir is located in a lower-temperature zone where a reactant precursor is liquid and the evaporation source reservoir is located in a higher-temperature zone where the reactant precursor has a desired vapor pressure, wherein the lower-temperature zone has a first temperature that is lower than a second temperature of the higher-temperature zone, wherein a fill level of melted liquid feedstock in the feedstock buffer reservoir is substantially equal to a fill level of melted liquid feedstock in the evaporation source reservoir.

8. The method of claim 7, wherein the evaporation source reservoir includes a trapezoidal cross-section evaporation source reservoir.

9. The method of claim 7, further comprising conveying feedstock from a feedstock source to the feedstock buffer reservoir.

10. The method of claim 9, wherein conveying feedstock from the feedstock source to the feedstock buffer reservoir comprises conveying feedstock from the feedstock source through an atmospheric load lock.

11. The method of claim 10, wherein conveying feedstock from the feedstock source through an atmospheric load lock comprises using a feed mechanism coupled to both the feedstock source and the feedstock buffer reservoir.

12. The method of claim 7, further comprising providing at least one of selenium, gallium, indium, silver or copper feedstock pellets to the feedstock buffer reservoir.

13. The method of claim 1, wherein conveying melted liquid feedstock from the feedstock buffer reservoir to the evaporation source reservoir comprises conveying melted liquid feedstock through a valve at the evaporation source reservoir.

14. The method of claim 7, wherein conveying melted liquid feedstock from the feedstock buffer reservoir to the evaporation source reservoir comprises conveying melted liquid feedstock through a valve at the evaporation source reservoir.

* * * * *